United States Patent
Conte et al.

(10) Patent No.: US 12,412,074 B2
(45) Date of Patent: Sep. 9, 2025

(54) METHOD FOR IN-MEMORY CONVOLUTIONAL COMPUTATION AND CORRESPONDING INTEGRATED CIRCUIT

(71) Applicants: STMicroelectronics S.r.l., Agrate Brianza (IT); STMicroelectronics (Rousset) SAS, Rousset (FR)

(72) Inventors: Antonino Conte, Tremestieri Etneo (IT); Francesco La Rosa, Rousset (FR)

(73) Assignees: STMICROELECTRONICS (ROUSSET) SAS, Rousset (FR); STMICROELECTRONICS S.R.L., Agrate Brianza (IT)

( * ) Notice: Subject to any disclaimer, the term of this patent is extended or adjusted under 35 U.S.C. 154(b) by 1024 days.

(21) Appl. No.: 17/393,075

(22) Filed: Aug. 3, 2021

(65) Prior Publication Data

US 2022/0044099 A1 Feb. 10, 2022

(30) Foreign Application Priority Data

Aug. 6, 2020 (FR) ........................................ 2008327

(51) Int. Cl.
*G06N 3/045* (2023.01)
*G06N 3/065* (2023.01)
(Continued)

(52) U.S. Cl.
CPC ............. *G06N 3/045* (2023.01); *G06N 3/065* (2023.01); *G11C 13/0004* (2013.01);
(Continued)

(58) Field of Classification Search
CPC ................................ G06N 3/045; G06N 3/065
See application file for complete search history.

(56) References Cited

U.S. PATENT DOCUMENTS 8,120,941 B2 * 2/2012 Carter ................. G11C 11/1659
365/100
10,430,493 B1 * 10/2019 Kendall ............. G11C 13/0026
(Continued)

FOREIGN PATENT DOCUMENTS

CN 110807519 A 2/2020
WO WO-2017105514 A1 * 6/2017

OTHER PUBLICATIONS

Communication Pursant to Article 94(3) EPC, European Office Action, EP Application No. 21189279.9, mailed Sep. 30, 2024, 5 pages.

*Primary Examiner* — Seokjin Kim
(74) *Attorney, Agent, or Firm* — Slater Matsil, LLP

(57) ABSTRACT

In an embodiment a method for convolutional computation (CNVL) of input values with weight factors includes converting the input values to voltage signals and successively applying the voltage signals on selected bit lines in an array of non-volatile memory points over respective time slots, each memory point comprising a phase-change resistive memory cell coupled to a bit line and having a resistive state corresponding to a weight factor, and a bipolar selection transistor coupled in series with the phase-change resistive memory cell and having a base terminal coupled with a word line, wherein the respective voltage signals bias the respective phase-change memory cells, integrating over the successive time slots read currents resulting from the voltage signals biasing the respective phase-change resistive memory cells and flowing through selected word lines and converting the integrated read currents to output values.

18 Claims, 7 Drawing Sheets

(51) Int. Cl.
*G11C 13/00* (2006.01)
*H10B 63/00* (2023.01)

(52) U.S. Cl.
CPC ........... *H10B 63/32* (2023.02); *G11C 13/004* (2013.01); *G11C 13/0069* (2013.01)

(56) References Cited

U.S. PATENT DOCUMENTS

| | | | |
|---|---|---|---|
| 11,501,829 B2 * | 11/2022 | Seo | G11C 11/54 |
| 11,574,209 B2 * | 2/2023 | Karunaratne | G06N 20/00 |
| 2010/0165713 A1 * | 7/2010 | Resta | G11C 8/10 |
| | | | 365/230.01 |
| 2012/0307542 A1 * | 12/2012 | Siau | H10N 70/011 |
| | | | 365/51 |
| 2021/0064379 A1 * | 3/2021 | Mattina | G06F 7/5443 |
| 2021/0209456 A1 * | 7/2021 | Tran | G06F 7/78 |
| 2021/0397932 A1 * | 12/2021 | Yudanov | G06N 3/063 |
| 2022/0398036 A1 * | 12/2022 | Sun | G06F 3/0616 |

* cited by examiner

[FIG. 5]
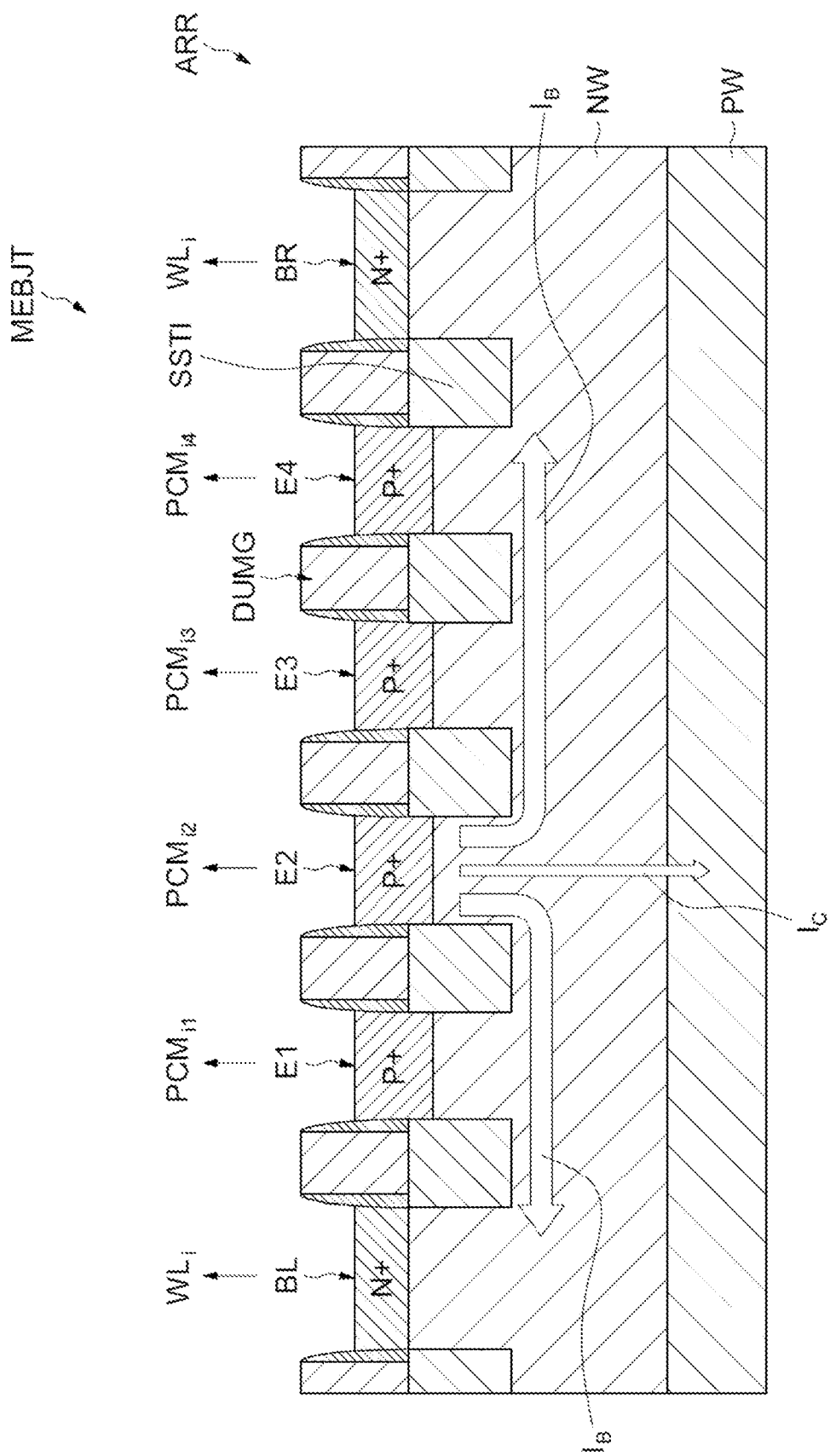

[Fig 6]
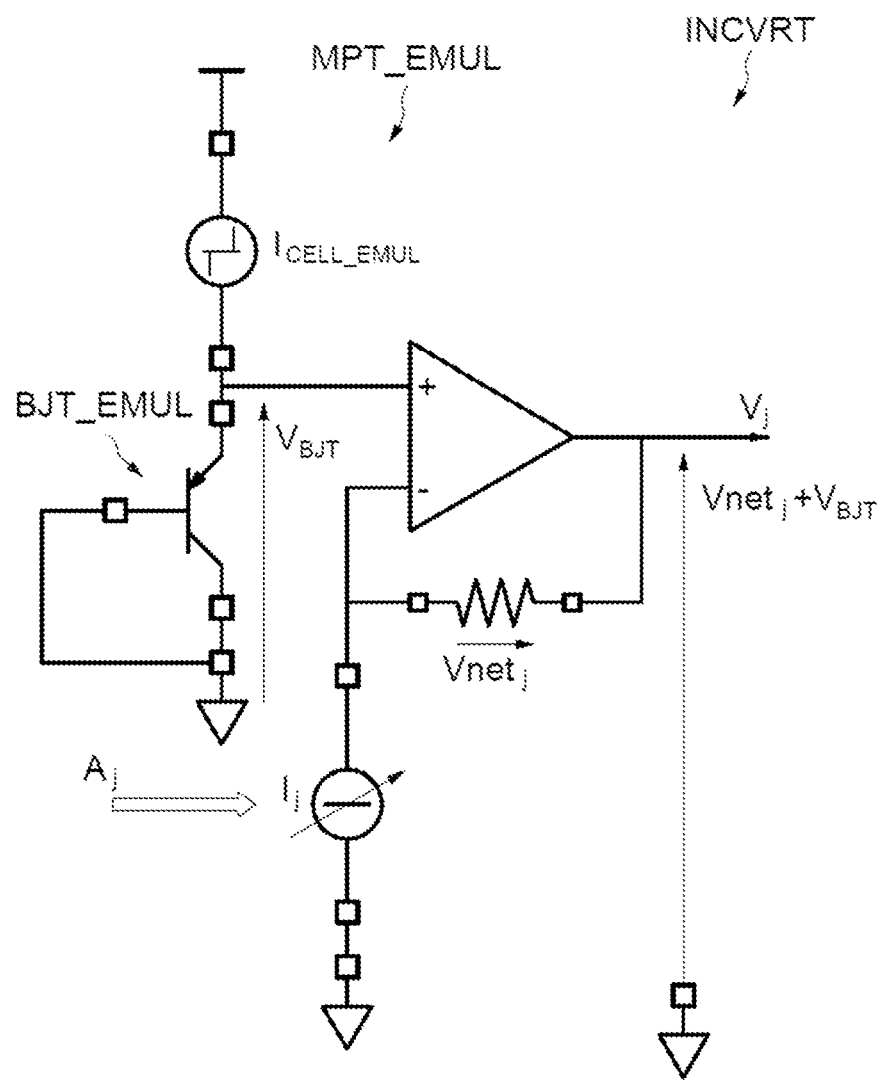

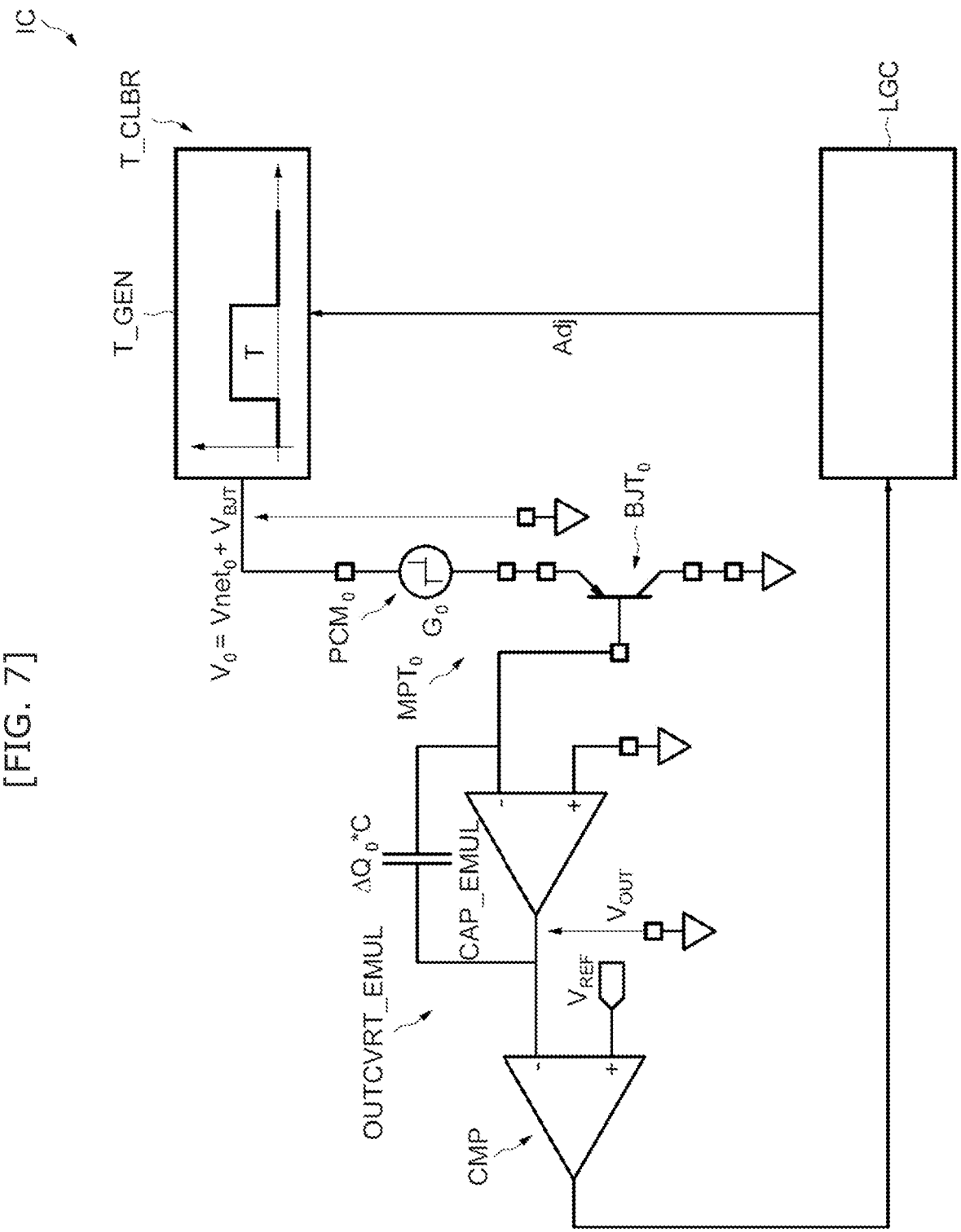
[FIG. 7]

METHOD FOR IN-MEMORY CONVOLUTIONAL COMPUTATION AND CORRESPONDING INTEGRATED CIRCUIT

CROSS-REFERENCE TO RELATED APPLICATIONS

This application claims the benefit of French Patent Application No. 2008327, filed on Aug. 6, 2020, which application is hereby incorporated herein by reference.

TECHNICAL FIELD

The disclosure relates to convolutional computation, in particular to in-memory calculation, for instance convolutional computation between layers of a neural network.

BACKGROUND

In the neural network technical field, the term "convolutional computation" designates a computation between an input space of a finite number of input values to an output space of a finite number of output values, where the calculation of each output value uses all the input values. The most convenient mathematical expression for such a calculation is a matrical product of a convolutional matrix operator with a vector of the input values, resulting in a vector of the output values. The output values are thus each obtained by a multiply and accumulate operation.

The term "in-memory computations" designates computations performed in real-time in a circuit storing the parameters of the calculations (called memory), and basically differs from classical computations because in-memory computations do not need to transfer values and parameters from a memory to a processing unit, which would perform the calculations. Moreover, processing units are typically limited in the number of elementary operations able to be computed at the same time, while in-memory computations generally compute all the results and provide them at once, independently of the quantity of calculated elements, in accordance with a limit volume of the in-memory computer.

Classical in-memory computations are performed by means of a resistive memory array, where each memory point has a resistive value that has been programmed according to the parameters of the calculation. The digital input values are converted into voltage signals applied on row lines of memory points, wherein a current with an intensity according to Ohm's law flows through each memory point. The currents flowing through column lines are summed by Kirchoff's law and are converted into digital output values, each output value thus resulting from a multiply and accumulate operation of the input values.

Classical techniques for selecting the resistive memory points in the array use MOS (acronym of Metal Oxide Semiconductor, well known acronym to the skilled person) access transistors, also called selectors. MOS transistors are used in particular for their ability to bidirectionally flow current, which is mandatory in certain resistive memory technologies, such as for instance MRAM (Magnetic Random Access Memory) for programming the cells.

However, the MOS transistor size must typically be large enough to drive high intensity write currents, and, given the typically boosted voltages applied to the MOS's gate oxide, scaling down MOS selectors introduces reliability issues.

SUMMARY

Embodiments provide in-memory computation method and apparatus that can be scaled down while remaining reliable and resilient to the conditions of use.

Further embodiments perform convolutional computation using an array comprising a plurality of phase-change memory cells and a plurality of bipolar transistors BJTs used as cell selectors.

According to an embodiment, a method for convolutional computation of input values with weight factors, comprises converting input values to voltage signals and successively applying the voltage signals on selected bit lines in an array of non-volatile memory points over respective time slots, each memory point comprising a phase-change resistive memory cell coupled with a bit line and having a resistive state corresponding to a weight factor, and a bipolar selection transistor coupled in series with the cell and having a base terminal coupled with a word line, the voltage signals thus biasing the respective phase-change memory cells, integrating over the successive time slots the read currents resulting from the voltage signals biasing the respective phase-change resistive memory cells and flowing through selected word lines and converting the integrated read currents to output values.

The memory points used in the method can thus be very compact since they include a bipolar transistor as a selector. Bipolar transistors can indeed be scaled down to a very compact footprint while showing high current driving capability and remaining highly reliable.

The advantageous use of bipolar transistors is permitted thanks to the phase-change resistive memory, because the phase resistive memory cells can be written, i.e. set or reset, depending on the shape of a signal having a unidirectional current flow.

Contrary to classical techniques where currents flowing in the same time in a line are summed by Kirchhoff's law, in this aspect, applying the voltage signals over the respective time slots limits the loss of voltage in word lines to the current of a single phase-change memory cell at a times, and therefore does not negatively affect the performance of the entire architecture. Integrating the resulting read currents efficiently sums the currents. Alternatively, if the voltage loss of one cell is low enough, more than one memory cell at the time can be activated, or time slots can overlap.

According to an embodiment, the method comprises performing a decoding operation selecting one selected bit line per input value, and selecting one selected word line per output value.

In other words, each memory point can be accessed thanks to its position at the intersection of one bit line and one word line. For instance, selecting the bit line can be achieved by biasing the bit line to the voltage signals, while selecting the word line can be achieved by grounding the selected word line and biasing the non-selected word line to an inhibiting potential configured to not drive current through the line.

According to an embodiment, the selection bipolar transistors are provided with a β-gain inferior than 1.

The "β-gain" (beta-gain) is the well-known ratio of the direct (DC) collector current to the direct base current in the forward-active region, and is also called "common-emitter current gain" or "h-parameter hFE".

Thus, in the selection bipolar transistors, the base current flowing to the word line is improved and a collector current loss is limited.

According to an embodiment, the selection bipolar transistors are provided in groups of multi-emitter bipolar elements, each comprising a respective number of emitter regions, a shared base region having two symmetrical base terminals coupled to a same word line, and a shared grounded collector region, each phase-change resistive memory cell being coupled with a respective emitter region.

This embodiment provides a very compact structure for the selection bipolar transistors. For instance, the selection bipolar transistors can be grouped by groups of four, in multi-emitter bipolar elements including for instance four lined-up emitter regions and the base regions located at both ends of the line.

According to an embodiment, the convolutional computation comprises performing multiply and accumulate operations of the input values with the weight factors, each resulting in one output value, and the method comprises programming the phase-change resistive memory cells in resistive states corresponding to the respective weight factors.

Programming the phase-change resistive memory cells is performed before the convolutional computation as such, i.e. before receiving the input values.

According to an embodiment, programming the phase-change resistive memory cells comprises, for each possible resistive state, flowing a write current in only one direction, for instance from the memory cell to the selection bipolar transistor.

According to an embodiment, integrating the read currents over the successive time slots uses an integrator circuit comprising an amplifier coupled with a feedback loop including a capacitive element and a switching circuit capable of reversing the polarity of the capacitive element in the feedback loop in response to a sign control signal.

Thus, the integration can integrate negative values by reversing the polarity of the capacitive element, and permits for instance to compute positive and/or negative weight factors.

According to an embodiment, converting input values to voltage signals comprises generating an offset voltage compensating for a threshold voltage of the selection bipolar transistors, in addition to a net converted voltage of each input value.

According to an embodiment, converting input values to voltage signals comprises emulating a selection bipolar transistor in a biased condition by an emulated read current, in order to generate the offset voltage under in-situ condition.

Thus, in these embodiments, the process and temperature variations of the bipolar transistors' threshold voltage are compensated, while converting input values to voltage signals are not affected by this compensation and can thus be optimized, for instance in terms of accuracy and dynamic range.

According to an embodiment, a time slot calibration operation comprises adjusting the time slot's duration in relation to a reference phase-change resistive memory cell and to a reference output value, compensating for possible temperature and process variations of the conductance of the phase-change resistive memory cells and of the β-gain of the selection bipolar transistors.

According to an embodiment, adjusting the time slots duration comprises emulating an output value resulting from integrating the read current resulting from a reference voltage signal biasing the reference phase-change resistive memory cell during an adjustable time slot, and comprises comparing the emulated output value with the reference output value in order to adjust the time slot duration.

Thus, in these embodiments, the process and temperature variations of the conductance of the phase-change resistive memory cells and of the β-gain of the selection bipolar transistors are in-situ compensated, which permit to provide undamaged output values.

According to another aspect, an integrated circuit for convolutional computation of input values with weight factors comprises an array of non-volatile memory points each comprising a phase-change resistive memory cell coupled with a bit line and configured to have a resistive state corresponding to a weight factor, and a selection bipolar transistor coupled in series with the cell and having a base terminal coupled with a word line, an input converter circuit configured to receive and convert the input values to voltage signals and to successively apply the voltage signals on selected bit lines over respective time slots, and an output converter circuit configured to integrate over the successive time slots the read currents resulting from the voltage signals biasing the respective phase-change resistive memory cells and flowing through selected word lines, and to convert the integrated read currents to outputs values.

According to an embodiment, the integrated circuit comprises a decoder circuit configured to select one selected bit line per input value, and to select one selected word line per output value.

According to an embodiment, the selection bipolar transistors are configured to be provided with a β-gain inferior than 1.

According to an embodiment, the selection bipolar transistors are grouped into multi-emitter bipolar elements, each comprising a respective number of emitter regions, a shared base region having two symmetrical base terminals coupled to a same word line, and a shared grounded collector region, each phase-change resistive memory cell being coupled with a respective emitter region.

According to an embodiment, the convolutional computation comprises multiply and accumulate operations of the input values with the weight factors, each resulting to one output value, and the phase-change resistive memory cells are configured to be programmed in resistive states corresponding to the respective weight factors.

According to an embodiment, the phase-change resistive memory cells are capable of being programmed, for each possible resistive state, by a write current flowing in only one direction.

According to an embodiment, the output converter circuit comprises, for each selected word line, an integrator circuit comprising an amplifier coupled with a feedback loop including a capacitive element and a switching circuit capable of reversing the polarity of the capacitive element in the feedback loop in response to a sign control signal.

According to an embodiment, the input converter circuit is configured to generate an offset voltage compensating for a threshold voltage of the selection bipolar transistors, in addition to a net converted voltage of each input value.

According to an embodiment, the input converter circuit comprises a memory point emulation circuit configured to emulate a selection bipolar transistor in a biased condition by an emulated read current, in order to generate the offset voltage under in-situ conditions.

According to an embodiment, a time slot calibration circuit is configured to adjust the time slots duration, in relation to a reference phase-change resistive memory cell and to a reference output value, in order to compensate for possible temperature and process variations of the conductance of the resistive phase-change memory cells and of the β-gain of the selection bipolar transistors.

According to an embodiment, the time slot calibration circuit comprises a memory point emulation circuit and an output converter circuit emulation circuit configured to emulate an output value resulting from integrating the read current resulting from a reference voltage signal biasing the reference phase-change resistive memory cell during an adjustable time slot, and comprises a comparator configured to compare the emulated output value with the reference output value in order to control a calibration feedback circuit adjusting the time slot duration.

BRIEF DESCRIPTION OF THE DRAWINGS

Other advantages and features of the invention shall appear from an examination of the detailed description of non-limitative embodiments of the invention, and of the drawings annexed thereto on which:

FIG. 5 illustrates a cross-sectional view at the semiconductor level of the array of a compact embodiment of the selection bipolar transistors;

FIG. 6 illustrates an embodiment of an input converter circuit configured to compensate for process and temperature variations of the bipolar transistor's threshold voltage; and FIG. 7 illustrates an embodiment of an input converter circuit configured to compensate for process and temperature variations of parameters affecting the convolutional computation.

DETAILED DESCRIPTION OF ILLUSTRATIVE EMBODIMENTS

Figure 1:
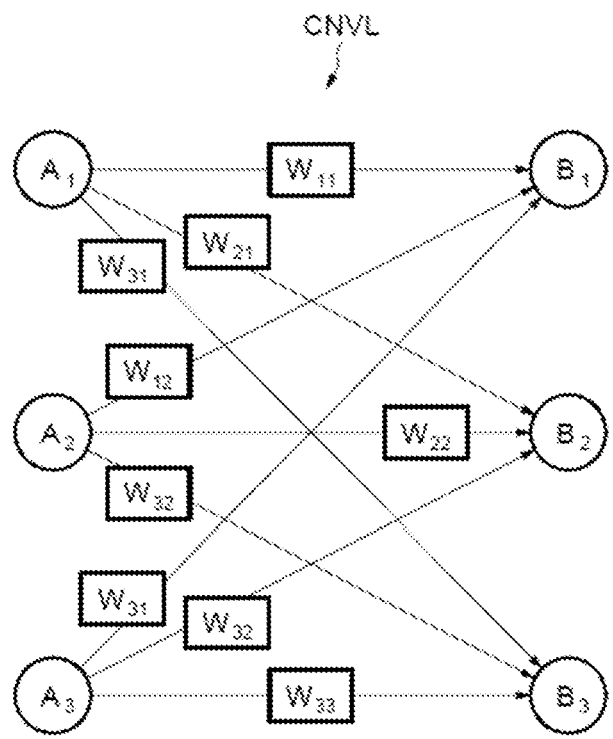
FIG. 1 illustrates an example of an artificial neural network and its mathematical representation.

FIG. 1 illustrates an example of an artificial neural network, comprising layers of "neurons" $A_1$-$A_2$-$A_3$, $B_1$-$B_2$-$B_3$, wherein each neuron is connected to all the neurons of the preceding layer by a respective number of "synapses". This biomimetic wording illustrates the mechanism of the calculation involved in this technical field, wherein all the values of an input space (e.g. neurons $A_1$-$A_3$ of the first layer) are weighted thanks to weight factors $W_{i1}$, $W_{i2}$, $W_{i3}$ (i.e. synapses) and accumulated for each value $B_i$ of an output space (e.g. neurons $B_1$-$B_3$ of the second layer). Such a calculation is called a convolutional computation CNVL. Input spaces and output spaces are composed of a finite number of values (neurons), and the dimension of these spaces can vary from an input space to an output space and can be larger (or lower) than 3 (in the illustrated example both spaces are of dimension 3).

The right side shows a convenient mathematical expression for such convolutional computations CNVL suitable for artificial neural networks, where the dimension of the input space is n, while the dimension of the output space is m.

The expression is basically a convolutional matrix operator MTXOP applied to an input vector VECTIN and resulting in an output vector VECTOUT. The matrix operator MTXOP has coefficients W11-Wmn set in accordance with the weight values (i.e. synapses), while the input vector VECTIN has the input values A1-An, and the output vector VECTOUT has the values B1-Bm.

Each output value Bi is thus obtained by a respective multiply and accumulate sequence MACi on the input values Aj according to a dedicated coefficient Wij. Consequently, each weight factor Wij is dedicated to a unique pair of one input value Aj and one output value Bi.

Figure 2:
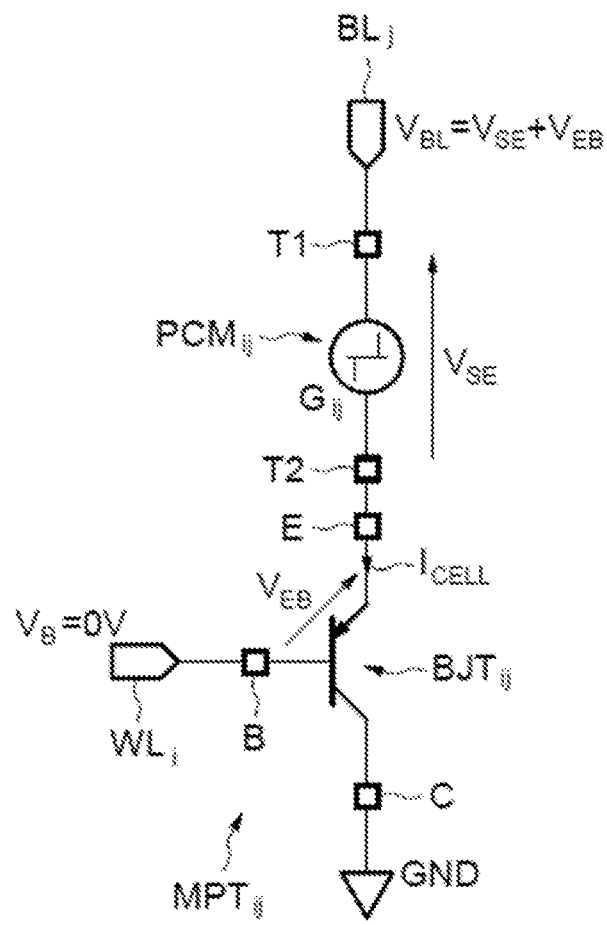
FIG. 2 illustrates a non-volatile memory point according to an embodiment.
Figure 4:
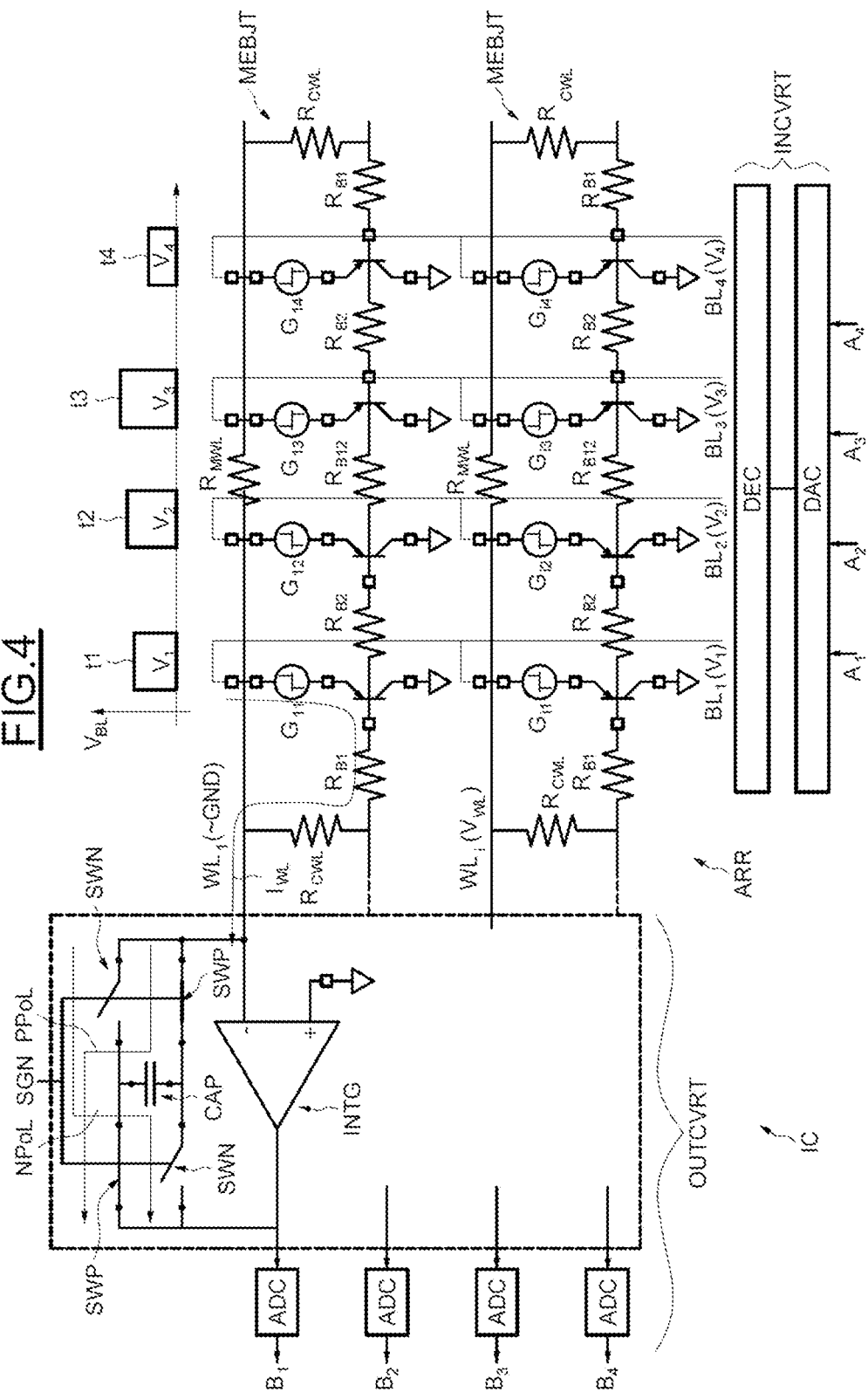
FIG. 4 illustrates a portion of an array of non-volatile memory points according to an embodiment, as described in relation with FIG. 2.

FIG. 2 illustrates an embodiment of a non-volatile memory point $MPT_{ij}$, isolated from an array intended to perform in-memory convolutional computations. The array, as depicted by FIG. 4, comprises a plurality of such memory points $MPT_{ij}$ that may be organized in rows through respective word lines, and columns through respective bit lines.

The memory point MPTij comprises a phase-change resistive memory cell PCMij comprising a first terminal T1 and a second terminal T2. The first terminal T1 is coupled to a bit line BLj, and the second terminal T2 is coupled with an emitter terminal E of a selection bipolar transistor BJTij. The base terminal B of the selection bipolar transistor BJTij is coupled to a word line WLi. The collector terminal C of the selection bipolar transistor BJTij is coupled to a reference ground potential GND.

Thus, the row and the column of the memory point MPTij can be selectively accessed in the array by respectively selecting both the word line WLi and the bit line BLj coupled to the memory point MPTij, in order to access the cells PCMij for write and read operations.

The phase change resistive memory cell PCMij exhibits a programmable resistance (as well as a programmable conductance Gij that is the inverse of the resistance), between its terminals T1 and T2. The programmable resistance/conductance Gij may be set by the means of a write operation.

Thus, under a given biasing condition between the bit line BLj and the word line WLi, the current flowing from the bit line BLj to the word line WLi is proportional to the conductance Gij and permits to read the information stored by the cell PCMij.

More precisely, in an example read operation, the base terminal B of the selection bipolar transistor BJTij is biased to the ground voltage VB=0V, while the first terminal T1 of the cell PCMij is biased to a bit line voltage VBL. The reading voltage VSE across the cell's terminals T1, T2 is thus equal to the bit line voltage VBL minus the emitter-base voltage VEB. Accordingly, to use a given reading voltage VSE, the bit line voltage is set as VBL=VSE+VEB.

The current IE flowing from the cell PCMij to the emitter terminal E has an intensity of the product of the conductance Gij times the reading voltage VSE, that is to say IE=Gij*VSE.

Figure 3:
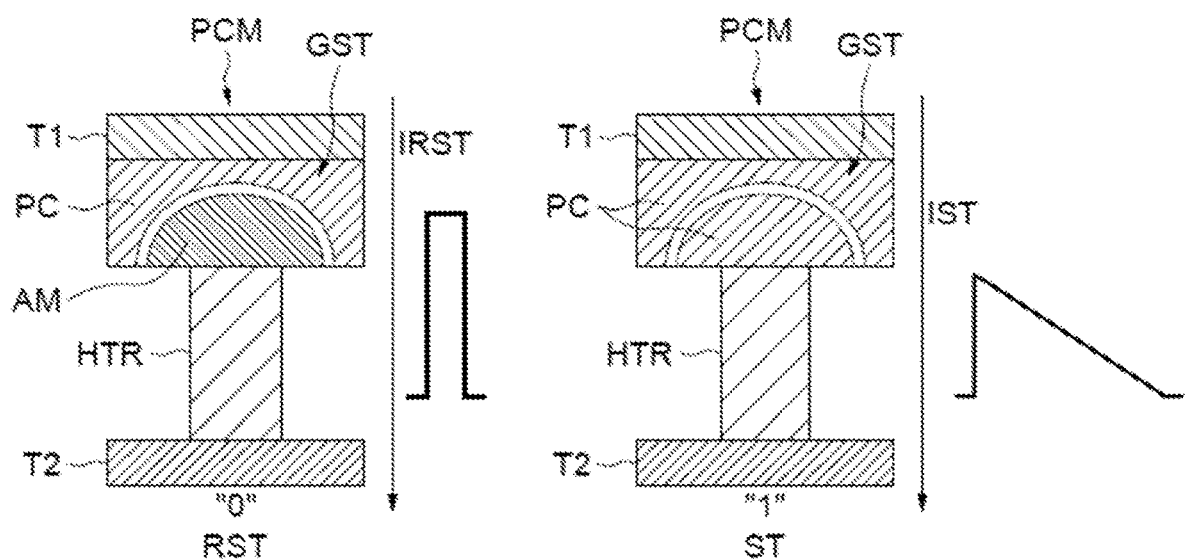
FIG. 3 illustrates a writing mechanism of a phase change resistive memory cell PCM.

FIG. 3 illustrates the writing mechanism of an advantageous example of a phase change resistive memory cell PCM. The same reference signs are used for designating the same elements as in FIG. 2.

The phase change material GST has the capability of changing its phase, the physical solid state of the material. For example, the phase change material GST (relating to the chemical symbols of the elements Germanium G, Antimony S and Tellurium T) thus providing a stoichiometric composition "GexSbyTez", classically Ge2Sb2Te5, the native state of which is crystalline or poly-crystalline PC. A heater element HTR is in contact with one side of the phase change material GST.

The first terminal T1 corresponds to a top electrode in contact with one (free) side of the phase change material PCM. The second terminal T2 corresponds to a bottom electrode in contact with the opposite (free) side of the heater element HTR.

When a sufficiently high current flows between the first and second terminals T1, T2 and through the heater element HTR, the Joule effect produces temperature conditions that can be controlled, such that the phase of the phase change material GST is controlled in a reversible manner.

Accordingly, it is possible to exceed the melting temperature of the material GST in order to produce an amorphous phase, or to remain between the crystallization temperature and the melting temperature of the material GST in order to produce a crystalline or poly-crystalline phase.

Accordingly, a reset writing operation IRST can change a local volume of the phase change material GST to an amorphous phase AM, and a set writing operation IST can change the amorphous local volume back to a crystalline or polycrystalline phase PC.

In the reset state RST, shown on the left of FIG. 3, the cell PCM comprises a local volume of amorphous phase change material GST exhibiting a high resistance (that can be assimilated to an infinite resistance value).

In the set state ST, shown on the right of FIG. 3, the cell PCM comprises a fully crystalized phase change material GST leading to the normal (i.e. lower) resistance value.

The reset writing operation may be performed by injecting a high rectangular current pulse for a short time IRST, for instance 240 µA (micro Ampere) for 100 ns (nano second), and/or 270 µA for loons, and/or 300 µA for loons.

The set writing operation may be performed by injecting a trapezoidal current pulse with slow current decreasing slope IST, for instance 160 µA decreasing to zero at 0.045 µA/ns, and/or 230 µA decreasing to zero at 0.045 µA/ns, and/or 260 µA decreasing to zero at 0.045 µA/ns.

With reference to FIG. 2, during the reset and set writing operations, the base terminal B of the selection bipolar transistor BJTij is biased to about 0V, i.e. to the ground reference voltage, and the write current pulses evacuate through the base terminal B and the collector terminal C.

FIG. 4 illustrates an embodiment of a portion of an array ARR of non-volatile memory points MPTij, as described in relation with FIG. 2, incorporated in an integrated circuit IC intended to perform in-memory convolutional computation.

The non-volatile memory points are thus each coupled with a bit line BL1, BL2, BL3, BL4, and with a word line WL1, WLi.

The memory points MPTij are selected and activated to perform the convolutional computation by an input converter circuit INCVRT and an output converter circuit OUTCVRT.

The input converter circuit INCVRT comprises a digital to analog converter DAC configured to receive input values A1-A4, for instance digital binary data, and to convert the input values A1-A4 to voltage signals V1-V4.

The input converter circuit INCVRT further comprises a decoder circuit DEC configured to select one bit line BLj for each input value Aj, and to successively apply the voltage signal V1-V4 on the selected bit line BL1-BL4 over respective time slots t1-t4.

The time slots t1-t4 may be sequentially spaced and may be not overlapping, or, if the resistive drop along the word line (as will be explained after) is low enough, time slots might overlap or be simultaneous.

The digital to analog converter DAC and the decoder circuit DEC are exemplary means constituting the input converter circuit INCVRT (which may include in addition classical means intended for driving input values) and are not limiting the implementation of the operation of the input converter circuit INCVRT.

The decoder circuit DEC is configured to select one word line WLi per output value Bi. As mentioned before in relation with FIG. 2, a word line WL1 is selected by applying a ground potential GND while other word lines WLi are biased to an inhibiting potential VWL. This mechanism of the decoder circuit DEC can be considered as being included in the output converter circuit OUTCVRT, or a distinct word line decoder circuit.

Accordingly, the selected cells PCMij are biased by the voltage signals V1-V4 on the one hand, and by the 0V word line voltage WL1 on the other hand.

With reference to FIG. 2, the reading voltage VSE across the selected cells PCMij resulting from this biasing condition generates a cell current IE flowing to the emitter terminal E of selection bipolar transistor BJTij.

The inhibiting potential VWL is applied to the word lines WLi that are not selected for the convolutional computation, and is set in accordance with the conversion range of the voltage signals V1-V4 to apply a read voltage VSE across the non-selected cells that would not cause a disruptive current flow through the non-selected cells. For example, the inhibiting potential may be set at around the maximum level generated by the converter DAC.

Furthermore, the other bit lines coupled to non-selected cells can be biased to about 0V, or be left floating, in order to not generate disruptive currents in the selected word line WL1 nor in the non-selected word lines WLi.

In the selected cells, the cell current IE=Gij*VSE flowing at the emitter terminal E is separated into a base current IB through the base terminal B and a collector current IC through the collector terminal C, in a proportion relative to the β-gain of the bipolar transistor BJTij, namely $1/(1+\beta)$ IE=IB and $\beta/(1+\beta)$IE=IC.

Accordingly, to draw more than half of the emitter current IE to the base terminal B, the β-gain must be less than 1, for instance if β is set to 0.5, then two-thirds (⅔) of the cell current IE is drawn through the base terminal B.

Thus, the selection bipolar transistors BJTij are advantageously configured to be provided with a β-gain less than 1, in order to reduce the current lost through the grounded collector terminal C.

The resulting current drawn by the base region is termed read current IB and flows through the respective word line WL1.

The output converter circuit OUTCVRT comprises one integrator circuit INTG per selected word line and coupled to the respective word line WL1. The integrator circuits INTG are configured to integrate the read currents IB over the successive time slots t1-t4.

The integrator circuits INTG each comprise an amplifier circuit, such as an operational amplifier, having a positive input grounded and a negative input coupled to the word line WLi.

A capacitive feedback loop FL is coupled from the output to the negative input in order to accumulate charges on a capacitive element CAP, from the currents flowing through the word line WLi.

The capacitive feedback loop advantageously includes switching circuits SWN, SWP configured to reverse the polarity PPol, NPol of the capacitive element CAP in the feedback loop in response to a sign control signal SGN.

Accordingly, depending on the sign control signal SGN, the read current IB flowing through the word line WL1 during each time slot t1-t4 can be added to the charge accumulation PPol, or subtracted from the charge accumulation NPol, on the capacitive element CAP.

Each analog to digital converter ADC is configured to convert the charge accumulated from the read current IB to an output value Bi, for instance digital output values.

In other words, the convolutional computation first comprises converting input values A1-A4 to voltage signals V1-V4 and successively applying the voltage signals on selected bit lines BL1-BL4 over respective time slots t1-t4. Secondly, the memory points are selected thanks to a word line bias voltage WL1=0V applied to the base region of the selection bipolar transistors BJTij. The voltage signals V1-V4 bias the respective phase-change resistive memory cells PCMij, which generate a cell current IE that is defined by the product of the cell's conductance value Gij with the respective voltage signal V1-V4. Thirdly, read currents IB resulting from the cell currents ICELL (FIG. 2) flow through the selection bipolar transistor's base regions to a same selected word line WL1 and are integrated over the successive time slots t1-t4. The integrated charges from read currents IB are then converted to output values Bi.

This mechanism is performed at the same time for all the selected word lines corresponding to the output values B1, B2, B3, B4, in this example.

Accordingly, each output value B1, B2, B3, B4 in the output vector OUTVECT (FIG. 1) is obtained in the same manner as described above for Bi, with respectively other memory points MPTij on the same bit lines BL1-BL4 and with the same input-converted voltage signal V1-V4, but on respectively other selected word lines and integrator circuits INTG. Accordingly, the whole output vector OUTVECT is computed at once with respect to the input vector INVECT, in this actual real time in-memory convolutional computation technique.

Consequently, each output value Bi results from a multiply and accumulate operations of the input values Aj with weight factors Wij (FIG. 1) provided by the cell's conductance values Gij.

As a matter of fact, the voltage VB1 applied to the analog to digital converter ADC providing Bi can be expressed as follows: $VBi=(T/C)*(Gi1*V1+Gi2N2+Gi3*V3+Gi4*V4)$, with T the duration of each time slot t1-t4 and C the capacitive value of the capacitive element CAP. This electrical equation thus physically provides the results of the mathematical expression of the convolutional multiply and accumulate operation MACi for Bi shown in FIG. 1.

The phase-change resistive memory cells PCMij are configured to exhibit resistive states Gij corresponding to the respective weight factors Wij, for instance according to the writing techniques described above in relation with FIG. 3. The aforementioned writing technique can set or reset the states of the memory cells, and thus corresponds to binary weight factors ("on" or "off"). However, the exact same technique as described here in relation with FIG. 4 applies for multilevel writing operation that handle multiple, i.e. strictly more than two, conductance values Gij of the memory cells and thus multiple weight factor values.

Also, since the converted-input voltage signals V1-V4 are successively applied over respective time slots t1-t4 on the selected bit lines BL1-BL4, then the read currents IB of the cells in the same word line WL1 are not flowing at the same time through the word line WL1. Thus, the intensity of the read currents IB is limited and a voltage drop caused by the resistance elements between the selection bipolar transistor BJTij and the output converter OUTCVRT is limited and does not diminish the analogical value of the signals.

Voltage drops are caused proportionally to resistive contribution of resistive elements RB1, RB2, RB12, RCWL, RMWL along each word line WLi, as these will be detailed with reference to FIG. 5. The resistive elements depicted in FIG. 4 are corresponding to an advantageously compact embodiment depicted in FIG. 5. The resistive contribution along the word line is however mainly induced by word line metal straps RMWL (i.e. metal lines provided across the array ARR in order to materialize the word line direction in the array's layout).

FIG. 5 illustrates a cross-sectional view at the semiconductor level of the array ARR of an advantageously compact embodiment of the selection bipolar transistors BJTij.

The selection bipolar transistors BJTij are grouped into multi-emitter bipolar elements MEBJT, in this example, each group includes four bipolar transistors.

The multi-emitter bipolar elements MEBJT each comprise a respective number (four) of highly doped P-type (P+) emitter regions E1-E4, a shared N-type doped base region NW and a shared P-type doped collector region PW. The shared base region NW includes two symmetrical highly doped N-type (N+) base terminals, base left BL, and base right BR coupled to a same word line WL1, and the shared collector region PW is grounded. For instance, the shared collector region PW is materialized by the semiconductor substrate.

In an alternative, NPN bipolar transistors may be used, with the proper complementary activation signals (namely the word line signals and the bit line signals).

In the illustrated example, the multi-emitter bipolar element MEBJT includes four lined-up emitter regions E1-E4, the two base regions BL, BR being located at opposite ends of the line.

The different emitter regions E1-E4 are located on the front face of the semiconductor substrate, i.e. that facing the interconnection metal levels where the phase change memory cells PCMij are located.

Accordingly, each emitter region E1-E4 is coupled to a respective phase-change resistive memory cell PCMi1-PCMi4, for instance by the means of a contact pillar.

The emitter regions E1-E4 are electrically separated one from another by dummy gate structures DUMG formed on the front face of the semiconductor substrate, and by shallow trench isolation elements SSTI with depths greater than the P+ implanted emitter regions. The dummy gate structures DUMG have the same structure as a MOS transistor gate but not functionally activated due to the presence of the shallow trench isolation elements SSTI aligned underneath.

As previously mentioned in reference with FIG. 2, the selection bipolar transistors BJTij are advantageously configured to be provided with a β-gain inferior than 1, for instance 0.5, in order to reduce the current losses to the collector region PW. The β-gain can be configured by varying for instance the doping concentrations of the base region NW and the emitter regions P+, and the thickness of the base region NW.

In such a multi-emitter bipolar element MEBJT, the resistance elements RB1, RB2, RB12, RCWL, RMWL depicted in FIG. 4 correspond respectively to:

the resistivity of the base region NW over each distance between an external emitter region E1, E4 and the closest base terminal BL, BR;

the resistivity of the base region NW over the distance between each internal emitter region E2, E3 and the closest external emitter region E1, E4;

the resistivity of the base region NW over the distance between the two internal emitter region E2, E3;

the resistance of the contact between the word line WLi and the base region NW, which may incorporate the resistances of the N+ base terminal, of a salicidation contact area, and of a metal contact pillar; and the resistance of the word line WLi metal strap in the distance between the two base terminals BL, BR.

A plurality of such multi-emitter bipolar elements MEBJT may be arranged in rows and columns in the array ARR.

FIG. 6 illustrates an embodiment of the input converter circuit INCVRT permitting to compensate for process and temperature variations of the bipolar transistor's threshold voltage.

The input converter circuit INCVRT comprises an emulating circuit of a memory point MPT_EMUL, including an emulated selection bipolar transistor BJT and an emulating current generator ICELL_EMUL.

The term "emulating" means reproducing the actual components and signals that are provided in the array. Accordingly, the emulated selection bipolar transistor BJT_EMUL is for instance obtained by the same manufacturing method and by the same parameters as the selection bipolar transistor BJTij in the array ARR.

The current generator is configured to generate a current ICELL_EMUL emulating the actual read current ICELL in the array, to bias the emulated selection transistor BJT_EMUL. The emulated selection transistor BJT_EMUL is diode-connected, i.e. its base terminal is connected to its collector terminal, and thus generate an emitter-gate threshold voltage VBJT under in-situ conditions.

The emitter-gate threshold voltage VBJT is supplied to a positive input of a comparator, which receives on its negative input a net-converted voltage Vnetj from one of the input values Aj.

The wording net-converted voltage Vnetj designates the input signal Aj accurately converted to the analog voltage signal Vnetj. For instance, the net-converted voltage Vnetj may be generated by a controllable current generator Ij controlled by the input value Aj biasing a feedback resistor between the amplifier's output and negative input.

Accordingly, the input converter circuit INCVRT is configured to generate each voltage Vj (j=1-4 in FIG. 4) including an offset voltage VBJT compensating for a threshold voltage variation of the selection bipolar transistors BJTij, in addition to the net-converted voltage Vnetj of each input value Aj.

Thus, by incorporating Vj=Vnetj+VBJT in the expression VBL=VSE+VEB in reference with FIG. 2, then VSE=Vnetj, and the cell current ICELL accurately results from the undistorted analog conversion of the input values Aj.

Thus, process and temperature variations of the threshold voltage of the array's bipolar transistors BJTij are compensated under real conditions, while converting the input values Aj to the voltage signals V1-V4.

FIG. 7 illustrates an embodiment of the input converter circuit INCVRT permitting to compensate for process and temperature variations of the parameter affecting the convolutional computation. In particular, this embodiment permits to compensate for variations of the conductance Gij of the array's resistive phase-change memory cells PCMij and of the β-gain of the array's selection bipolar transistors BJTij.

The integrated circuit CI includes in addition a time slot calibration circuit T_CLBR configured to adjust Adj the time slot duration T with respect to the external condition of use, such as temperature, and with respect to random process variations.

The calibration process may be performed before each execution of a convolutional computation or each time the integrated circuit is turned on. The calibration process described below does not take longer than a few microseconds.

The time slot calibration circuit T_CLBR comprises a time slot generator T_GEN configured to generate a reference voltage signal V0 during an adjustable time slot T, an emulated memory point MPT0, and an output converter emulating circuit OUTCVRT_EMUL.

The emulated memory point MPT0 comprises a reference phase change memory cell PCM0 and a reference bipolar transistor BJT0, both emulating those present in the array ARR.

The reference phase change memory cell PCM0 is configured to exhibit a reference conductance value G0 in a written set state. For instance, the reference conductance G0 is defined for each integrated circuit IC during a testing phase in the production process, usually called "EWS" for "Electrical Wafer Sorting".

The output converter emulating circuit OUTCVRT_EMUL comprises a similar configuration of the integrator circuit INTG as depicted by FIG. 4, emulating the elements in the array ARR, i.e. an amplifier circuit having a grounded positive input, a negative input coupled to the base terminal of the reference bipolar transistor BJT0, and a capacitive feedback loop coupled from the output to the negative input accumulating charges in a capacitive element CAP_EMUL from the currents flowing from the base terminal.

A comparator circuit CMP is configured to compare the output voltage signal VOUT of the integrator amplifier circuit with a reference output voltage signal VREF. The comparison result is converted by a calibration logic circuit LGC to an adjusting control signal Adj suitable for controlling the duration T of the time slots generated by the time slot generator T_GEN.

The calibration process comprises adjusting the time slots duration T with respect to the reference phase-change resistive memory cell PCM0 and to the reference voltage signal V0, compensating for possible temperature and process variations of the conductance Gij of the phase-change resistive memory cells PCMij and of the β-gain of the selection bipolar transistors BJTij.

For that purpose, the calibration process comprises emulating the output voltage VOUT resulting from integrating the read current resulting from the reference voltage signal V0 biasing the reference phase-change resistive memory cell PCM0 during an adjustable time slot T, and comprises comparing CMP the emulated output value VOUT with a reference output value VREF in order to adjust Adj the time slot duration T.

Advantageously, the time slot generator T_GEN is configured to generate a reference voltage signal V0 that is the sum of the net reference voltage signal Vnet0 and a bipolar transistor threshold offset VBJT, i.e. V0=Vnet0+VBJT, as described before in relation with FIG. 6.

Thus, in accordance with the general bipolar transistor law IB=IE/(i+β), and wherein ΔQ0 is a reference charge cumulated on the feedback capacitive element CAP_EMUL, achieved by applying the reference voltage signal Vnet0, ΔQ0 can be expressed as ΔQ0=T0*IB0=T0*IE0/(1+β0), wherein G0 is a reference cell in set status, T0 is a pulse duration at a reference room temperature defined to achieve ΔQ0, and VREF corresponds to the voltage VOUT provided by the reference charge cumulated ΔQ0.

With IE0=Vnet0*G0, then: ΔQ0=T0*Vnet0*G0/(1+β0).

Thus, $T_0 = (\Delta Q_0 / V\text{net}_0) * (1+\beta_0) / G_0$      [Eq1]

Then, when $\beta_0$ and $G_0$ vary with respect to process vagaries and temperature, the time slot calibration circuit T_CLBR adjusts the pulse duration T to compensate these variations such that the same quantity of reference charges $\Delta Q_0$ are accumulated, i.e. to achieve $V_{OUT}=V_{REF}$ in the loop of the time slot calibration circuit T_CLBR.

Thus, with $\beta_C$ and $G_C$ the variated $\beta$-gain and conductance, the calibrated time slot duration $T_C$ is expressed, from Eq1 as follows:

$$T_C=(\Delta Q_0/V\text{net}_0)*(1+\beta_C)/G_C \quad [\text{Eq2}]$$

Accordingly, a voltage signal $V\text{net}_j$ that has been converted from the input value $A_j$ provides a cumulated charge quantity $\Delta Q_{j0}$ at room temperature, expressed as $$\Delta Q_{j0}=T_0*V\text{net}_j*G_0/(1+\beta_0), \text{ and, with Eq1:}$$

$$\Delta Q_{j0}=V\text{net}_j*(\Delta Q_0/V\text{net}_0) \quad [\text{Eq3}]$$

The real-condition cumulated charge quantity $\Delta Q_{jC}$, from a voltage signal $V\text{net}_j$, with the in-situ adjusted time slot $T_C$, is expressed as: $\Delta Q_{jC}=T_C*V\text{net}_j*G_C/(1+\beta_C)$ and, with $T_C$ from Eq2,
$\Delta Q_{jC}=V\text{net}_j*(\Delta Q_0/V\text{net}_0)$ and thus, according to Eq. 3, $\Delta Q_{jC}=\Delta_{j0}$.

This development means that after calibration and obtaining the calibrated time slot $T_C$, the charge accumulated for any value $V\text{net}_j$ is invariant versus temperature and process random variations.

The embodiments that has been described in relation with FIGS. 1 to 7 advantageously allow an in-memory convolutional computation to be performed with very compact bipolar transistors as selectors of phase change resistive cells. Positive and negative weight factors can be computed, and embodiments are usable with binary weight factors and with multilevel weight factors.

The distributed time slots of the embodiments provide no cumulated voltage drop effect along the array's word lines or bit lines, and permits to save energy consumption. Classical constraints of the bipolar transistors, such as threshold voltage and $\beta$-gain variability, as well as cell's conductance variability, are overcome in the embodiments.

What is claimed is:

1. A method for convolutional computation (CNVL) of input values with weight factors, the method comprising:
   converting the input values to voltage signals and successively applying the voltage signals on selected bit lines in an array of non-volatile memory points over respective time slots, each non-volatile memory point comprising a phase-change resistive memory cell coupled to a bit line and having a resistive state corresponding to a weight factor, and a bipolar selection transistor coupled in series with the phase-change resistive memory cell and having a base terminal coupled with a word line, wherein the respective voltage signals bias the respective phase-change memory cells, and wherein the bipolar selection transistors are provided with a $\beta$-gain less than 1;
   integrating over successive time slots read currents resulting from the voltage signals biasing the respective phase-change resistive memory cells and flowing through selected word lines; and
   converting integrated read currents to output values.

2. The method according to claim 1, further comprising performing a decoding operation by selecting one selected bit line per input value, and selecting one selected word line per output value.

3. The method according to claim 1, wherein the bipolar selection transistors are grouped in groups of multi-emitter bipolar elements, and wherein each bipolar element comprises a number of emitter regions, a shared base region having two symmetrical base terminals coupled to the same word line, and a shared grounded collector region, each phase-change resistive memory cell being coupled with a respective emitter region.

4. The method according to claim 1, further comprises programming the phase-change resistive memory cells in resistive states corresponding to the respective weight factors.

5. The method according to claim 4, wherein programming the phase-change resistive memory cells comprises, for each resistive state, flowing a write current in only one direction.

6. The method according to claim 1, wherein integrating over the successive time slots the read currents comprises using an amplifier coupled with a feedback loop including a capacitive element and a switching circuit capable of reversing a polarity of the capacitive element in the feedback loop in response to a sign control signal.

7. The method according to claim 1, wherein converting the input values to the voltage signals comprises generating an offset voltage compensating for a threshold voltage of the bipolar selection transistors, in addition to a net converted voltage of each input value.

8. The method according to claim 7, wherein converting the input values to the voltage signals comprises emulating a bipolar selection transistor in a biased condition by an emulated read current, in order to generate the offset voltage under in-situ condition.

9. The method according to claim 1, wherein a time slot calibration operation comprises adjusting a time slots duration, in relation to a reference phase-change resistive memory cell and to a reference output value, compensating for possible temperature and process variations of conductances of the phase-change resistive memory cells and of the $\beta$-gain of the bipolar selection transistors.

10. The method according to claim 9, wherein adjusting the time slots duration comprises emulating an output value resulting from integrating the read current resulting from a reference voltage signal biasing the reference phase-change resistive memory cell during an adjustable time slot, and comprises comparing the emulated output value with the reference output value in order to adjust the time slots duration.

11. An integrated circuit for convolutional computation (CNVL) of input values with weight factors, the integrated circuit comprising:
   an array of non-volatile memory points, each non-volatile memory point comprising a phase-change resistive memory cell coupled with a bit line and configured to provide a resistive state corresponding to a weight factor, and a bipolar selection transistor coupled in series with the phase-change resistive memory cell and having a base terminal coupled with a word line, wherein each bipolar selection transistor has a $\beta$-gain less than 1;
   an input converter circuit configured to provide and convert the input values to voltage signals and to successively apply the voltage signals on selected bit lines over respective time slots; and
   an output converter circuit configured to:
      integrate over successive time slots read currents resulting from the voltage signals biasing the respective phase-change resistive memory cells and flowing through selected word lines, and
      convert integrated read currents to outputs values.

12. The integrated circuit according to claim 11, further comprising a decoder circuit configured to:
  select one selected bit line per input value, and
  select one selected word line per output value.

13. The integrated circuit according to claim 11,
  wherein the bipolar selection transistors are grouped into multi-emitter bipolar elements,
  wherein each multi-emitter bipolar element comprising a number of emitter regions, a shared base region having two symmetrical base terminals coupled to the same word line, and a shared grounded collector region, and
  wherein each phase-change resistive memory cell is coupled with a respective emitter region.

14. The integrated circuit according to claim 11, wherein the output converter circuit comprises, for each selected word line, an integrator circuit comprising an amplifier coupled with a feedback loop including a capacitive element and a switching circuit capable of reversing a polarity of the capacitive element in the feedback loop in response to a sign control signal.

15. The integrated circuit according to claim 11, wherein the input converter circuit is configured to:
  generate an offset voltage compensating for a threshold voltage of the bipolar selection transistors, and
  provide a net converted voltage of each input value.

16. The integrated circuit according to claim 11, wherein the input converter circuit comprises an emulating circuit of a memory point configured to emulate a bipolar selection transistor in a biased condition by an emulated read current, in order to generate an offset voltage under in-situ condition.

17. The integrated circuit according to claim 11, wherein a time slots calibration circuit is configured to adjust a time slots duration, in relation to a reference phase-change resistive memory cell and to a reference output value, in order to compensate for possible temperature and process variations of conductances of the phase-change resistive memory cells and of the β-gain of the bipolar selection transistors.

18. The integrated circuit according to claim 17, wherein the time slot calibration circuit comprises an emulating circuit of a memory point and an emulating circuit of an output converter circuit, configured to emulate an output value resulting from integrating a read current resulting from a reference voltage signal biasing the reference phase-change resistive memory cell during an adjustable time slot, and comprises a comparator configured to compare the emulated output value with the reference output value in order to control a calibration feedback circuit adjusting the time slots duration.

* * * * *